United States Patent [19]
Feldman

[11] Patent Number: 5,986,391
[45] Date of Patent: Nov. 16, 1999

[54] TRANSPARENT ELECTRODES

[75] Inventor: Bernard Feldman, Corralitos, Calif.

[73] Assignee: Feldman Technology Corporation, Watsonville, Calif.

[21] Appl. No.: 09/038,927

[22] Filed: Mar. 9, 1998

[51] Int. Cl.$^6$ ................ H01J 29/64; H01J 1/62
[52] U.S. Cl. .............. 313/326; 313/512; 313/505; 313/495; 313/493; 313/309
[58] Field of Search ...................... 313/500, 501, 313/502, 503, 504, 505, 506, 507, 508, 509, 510, 511, 512, 326, 309, 336, 351, 493, 483, 495

[56] References Cited

U.S. PATENT DOCUMENTS

| | | |
|---|---|---|
| 3,600,798 | 8/1971 | Lee . |
| 3,675,220 | 7/1972 | Snaper et al. . |
| 3,700,946 | 10/1972 | Caras . |
| 3,731,986 | 5/1973 | Fergason . |
| 3,739,218 | 6/1973 | Maloney . |
| 3,928,658 | 12/1975 | van Boxtel et al. . |
| 3,941,630 | 3/1976 | Larrabee . |
| 4,076,386 | 2/1978 | Giglia . |
| 4,098,939 | 7/1978 | Kuroda et al. . |
| 4,235,528 | 11/1980 | Yano et al. . |
| 4,254,360 | 3/1981 | Haven . |
| 4,297,022 | 10/1981 | Lester . |
| 4,307,372 | 12/1981 | Matsui et al. . |
| 4,335,328 | 6/1982 | Haven . |
| 4,513,062 | 4/1985 | Suzuki et al. . |
| 4,601,097 | 7/1986 | Shimbo . |
| 4,700,458 | 10/1987 | Suzuki et al. . |
| 4,713,579 | 12/1987 | Miura . |
| 4,728,176 | 3/1988 | Tsuboyama et al. . |
| 4,728,997 | 3/1988 | Szydlo et al. . |
| 4,758,476 | 7/1988 | Sekine et al. . |
| 4,800,263 | 1/1989 | Dillon et al. . |
| 4,814,668 | 3/1989 | Tohda et al. . |
| 4,822,993 | 4/1989 | Dillon et al. . |
| 4,851,659 | 7/1989 | Dillon et al. . |
| 4,913,674 | 4/1990 | Nicholas . |
| 4,954,225 | 9/1990 | Bakewell . |
| 4,954,386 | 9/1990 | Mizunoya et al. . |
| 4,980,546 | 12/1990 | Berger . |
| 5,000,545 | 3/1991 | Yoshioka et al. . |
| 5,003,167 | 3/1991 | Arques . |
| 5,007,716 | 4/1991 | Hanyu et al. . |
| 5,076,667 | 12/1991 | Stewart et al. . |
| 5,124,826 | 6/1992 | Yoshioka et al. . |
| 5,151,806 | 9/1992 | Kawamoto et al. . |
| 5,198,377 | 3/1993 | Kato et al. . |
| 5,203,731 | 4/1993 | Zimmerman .............. 445/24 |
| 5,212,575 | 5/1993 | Kojima et al. . |
| 5,342,477 | 8/1994 | Cathey . |
| 5,399,936 | 3/1995 | Namiki et al. . |
| 5,432,625 | 7/1995 | Morin et al. . |
| 5,445,898 | 8/1995 | Budzilek et al. . |
| 5,445,899 | 8/1995 | Budzilek et al. . |
| 5,491,376 | 2/1996 | Levine et al. . |
| 5,517,341 | 5/1996 | Kim et al. . |
| 5,517,342 | 5/1996 | Kim et al. . |
| 5,521,465 | 5/1996 | Budzilek et al. . |
| 5,559,399 | 9/1996 | Tanski et al. . |
| 5,608,287 | 3/1997 | Hung et al. .............. 313/503 |
| 5,885,498 | 3/1999 | Matsuo et al. .......... 313/504 |

*Primary Examiner*—Nimeshkumar D. Patel
*Assistant Examiner*—Joseph Williams
*Attorney, Agent, or Firm*—Oblon, Spivak. McClelland, Maier & Neustadt, P.C.

[57] ABSTRACT

The present invention provides for transparent electrodes useful in display devices. The transparent electrodes are deposited on a substrate and formed with one or more apertures on their top surface that permit a second electrode, formed on the transparent electrode, to dip down and make contact with the substrate. The second electrode is made of an opaque conductive material that lowers the electrical resistance of the transparent electrode.

17 Claims, 1 Drawing Sheet

TRANSPARENT ELECTRODES

BACKGROUND OF THE INVENTION

1. Field of the Invention

The present invention relates to transparent electrodes useful in display devices.

2. Description of the Related Art

Flat panel display technology is becoming increasingly important in electronic devices requiring displays which range in size from wrist watches to lap-top computer screens to hang-on-the-wall TVs to scoreboards. These displays employ various technologies to create thin, high resolution displays wherein each pixel is activated by a set of electrodes. The electrodes activate the pixels by exciting voltage-responsive substances such as liquid crystals, plasmas, phosphors, and electroluminescent materials that are trapped between the electrodes. When the electrodes activate a pixel, light is transmitted to the viewer of the display. For many displays, one electrode must be made of a transparent material that does not interfere with the light reaching the viewer.

The transparent electrode material must be electrically conductive. Unfortunately, conductive materials which have transparent qualities also tend to have high electrical resistance when compared to opaque metallic conductors. The high resistance values may cause the display device to run at a slower rate, remove the voltage across the pixel variably and/or consume more power. Moreover, when the surface resistance of the transparent electrode drops below approximately 10 ohms per square, the electrodes have difficulty activating pixels for some, particularly larger, display types.

One approach for enhancing the conductivity of transparent electrodes is the depositing of a thin strip of highly conductive opaque material in contact with the transparent electrode. This strip will be hereinafter referred to as the opaque conductor. The opaque conductor usually comprises metals such as gold, silver, aluminum, copper, chrome, and combinations thereof. Opaque conductors deposited on the transparent electrode are preferably thick enough to reduce the resistance of the transparent electrode by two to four orders of magnitude. The opaque conductor, however, is not wide enough to noticeably block the light from the flat panel display from reaching the viewer.

Previous attempts to bring opaque conducting strips in contact with transparent electrodes include forming the opaque strip directly on a glass substrate, and then overlaying the transparent electrode on top of the opaque conducting strip and the substrate (see Tohda et al, U.S. Pat. No. 4,814,668, the contents of which are hereby incorporated by reference).

Another approach has been to form a strip of transparent electrode material directly on a glass substrate, and then deposit a strip of the opaque conductor that has one edge partially extended over the top of the transparent electrode strip, and the opposite edge over the side of electrode and making contact with the substrate (see Narniki et al, U.S. Pat. No. 5,399,936, the contents of which are hereby incorporated by reference).

A still further approach to contacting opaque conductors with transparent electrodes involves forming a strip of transparent electrode on a glass substrate and then sandwiching two opaque conducting strips on opposite sides of the electrode strip and also in contact with the substrate (see Cathey, U.S. Pat. No. 5,342,477, the contents of which are hereby incorporated by reference).

Unfortunately, it has proven difficult to provide an opaque conductor which properly adheres to the surface of the transparent electrode. Delamination of the opaque conductor from the underlying transparent electrode is a major problem in the development of transparent electrodes for display devices.

SUMMARY OF THE INVENTION

Accordingly, one object of this invention is to provide an opaque conductor on a transparent electrode which does not delaminate from the electrode.

Another object of the invention is a process of using the invention electrodes in display devices and display devices comprising at least one invention electrode.

A further object of the invention is a process of forming an adherent opaque conductor on a transparent electrode and vice versa.

These and other objects of the present invention have been satisfied by providing an opaque conductor on a transparent electrode which opaque conductor contacts the underlying substrate through one or a plurality of apertures formed in the transparent electrode. The arrangement of opaque and transparent conductors can also be reversed, if desired.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

In the FIGS. 1 is the substrate, 2 is transparent conductor, 3 is opaque conductor over substrate and penetrating an aperture, and 4 is opaque conductor over transparent conductor. In FIGS. 2, 5 is the undercut region.

DETAILED DESCRIPTION OF THE PREFERRED EMBODIMENTS

For ease of discussion, the present invention will be described without reference to a particular type of display. One having ordinary skill in the art, upon being instructed by the description of the present invention, would be able to understand the application of the invention to displays employing at least one transparent electrode. These types of displays include electroluminescent displays, plasma displays, electrochromic displays, liquid crystal displays and any other display employing opaque and transparent conductors.

The transparent electrode of the present invention preferably has one or more apertures (holes) through which the opaque conductor can make contact with the underlying substrate. The apertures may be any size or shape and may be in any pattern that can be defined by the transparent electrode. The apertures may be formed anywhere on the electrode, and may be spaced at periodic intervals, or in a more random distribution.

In a preferred embodiment, the apertures are 1–50 μm wide, preferably 5–10 μm wide, and have a preferred area of ≦100 sq. microns. In another preferred embodiment, the apertures assume geometric shapes selected from the group consisting of circles, squares and rectangles. In a further preferred embodiment, the apertures are formed in the transparent electrode in a pattern shown in FIG. 1.

If the electrodes 2 are fabricated from substantially transparent material, large portions of the electrodes 2 should still be substantially transparent.

Figure 2:
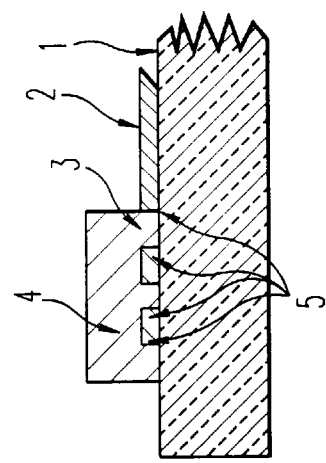
FIG. 2 is a cross sectional side view at line A—A of FIG. 1 of the opaque conductor deposited on the electrode that is lying on the substrate.

The substrate 1, as shown in FIG. 2, is preferably made of glass, ceramic, or plastic, and more preferably Soda Line Float Glass or Corning 7059 borosilicate glass that is uncoated or blackened, doped, etched, mirrored or otherwise treated.

Figure 1:
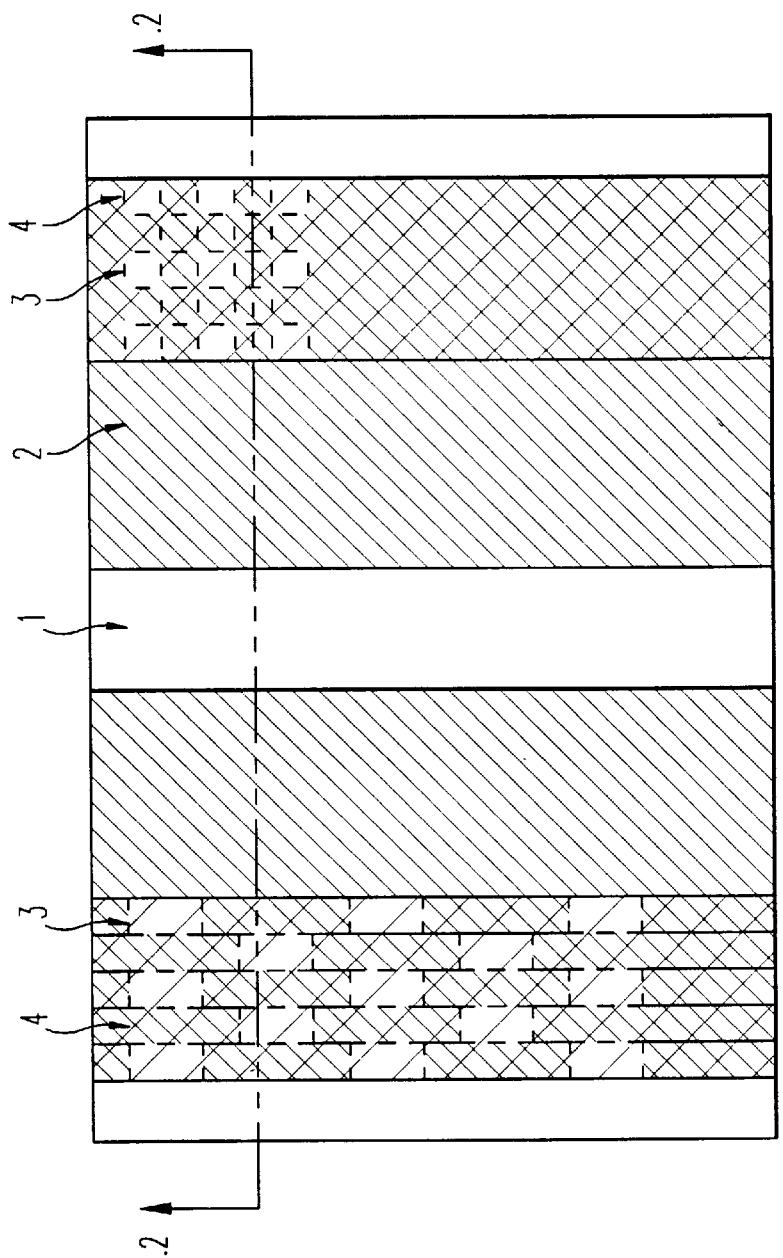
FIG. 1 is a top view of an invention opaque conductor on a transparent electrode lying on a substrate.

As shown in FIG. 1, the transparent electrode 2 is preferably fabricated from a thin film of conductive transparent material, such as indium oxide ($In_2O_3$), tin oxide ($SnO_2$), indium-tin-oxides (ITO=$In_2O_3/SnO_2$), etc. Preferred thicknesses of these films are 500 to 5000 Å. Transparent electrodes can also be made from ultra-thin films of normally opaque metals such as copper, silver, gold, platinum, etc. preferably having a thickness of 100 to 300 Å.

The opaque conductor 3,4 usually comprises metals such as gold, silver, aluminum, copper, chrome, and combinations thereof. The thickness of the opaque conducting strip is preferably 0.5 to 50 $\mu$m, more preferably 1 to 10 $\mu$m, and is preferably of sufficient cross section to reduce the resistance of the transparent electrode by two to four orders of magnitude. The opaque conductor, however, is preferably not wide enough to noticeably block light emitted by the flat panel display from reaching the viewer.

Depending on the display, there may be other layers, conductive or otherwise, disposed on the electrode 2 and/or 3 and the substrate 1. Additionally, there may be energy responsive elements or materials (e.g., plasma, liquid crystals, phosphors, dielectric materials etc.) disposed over the substrate and transparent/opaque electrode structure.

The transparent electrode material may be deposited on the substrate preferably by conventional deposition techniques such as chemical vapor deposition (CVD), evaporation, metal film sputtering, etc. In a preferred embodiment, a layer of transparent electrode material, preferably tin oxide (TO) or indium-tin oxide (ITO), is deposited on the substrate and the electrode strips are formed from the TO/ITO layer by a conventional etch-back method such as described in Budzilek et al, U.S. Pat. No. 5,445,898 (the contents of which are hereby incorporated by reference). In this method, the parts of the TO/ITO layer that will become the transparent electrode strips are cleaned and covered with an etchant-resistant mask. The etchant-resistant mask can be made by applying a suitable photoresistant chemical to the TO/ITO layer, exposing the photoresist chemical to the appropriate wavelength of light, and developing the photoresist chemical. Unmasked parts of the TO/ITO are removed with a suitable etchant to form channels in the TO/ITO layer that define the gaps separating the transparent electrode strips. Similar techniques are preferably used to form the pattern of apertures (holes) in the transparent conductor.

The opaque conductor strip may be deposited on the transparent electrode by any means such as chemical vapor deposition (CVD), electroless or elecrolytic metal deposition, evaporation, metal film sputtering, or other suitable deposition methods. When the method of deposition of the opaque conductor is not a line-of-sight type deposition such as sputtering or evaporation, but rather a non-line-of-sight deposition such as CVD or electroless or electroplated deposition, the undercut under the resist (5, FIG. 2) serves to enhance the adhesion of the opaque conductor to the substrate by functioning as mechanical anchor points at short ranges. This phenomenon is a consequence of the deposition of the opaque conductor under the resist into the undercut region created when the transparent electrode is etched to form apertures. In a well-controlled etch process, this undercut corresponds to the thickness of the transparent electrode. A line-of-sight deposition process produces no anchor deposit into the undercut region.

When the opaque conductor is underneath the transparent conductor the same techniques described above can be used to form apertures in the opaque conductor and overlay the transparent conductor.

While the particular conductive strips and transparent electrodes used in flat panel displays as shown herein and disclosed in detail are fully capable of obtaining the objects and advantages hereinbefore stated, it is to be understood that it is merely illustrative of the presently preferred embodiments of the invention and that no limitations are intended to the details of construction or design herein shown other than as described in the appended claims. One with ordinary skill in the art would understand that the present invention could be applied to display technologies which employ orthogonal electrically conductive row and column electrodes to induce a visible pixel to a viewer, such as a plasma displays, electroluminescent or electrochromic displays, and liquid crystal displays among others.

What is claimed as new and is desired to be secured by Letters Patent of the United States is:

1. An electrode comprising:

a substrate;

a first electrode on said substrate; and a second electrode on said first electrode;

wherein said first electrode contains one or a plurality of apertures, and said second electrode contacts said substrate through at least one of said apertures in said first electrode.

2. The electrode of claim 1, wherein said first electrode is transparent.

3. The electrode of claim 1, wherein said first electrode comprises a material selected from the group consisting of indium oxide ($In_2O_3$), tin oxide ($SnO_2$), and indium-tin-oxides ($In_2O_3/SnO_2$).

4. The electrode of claim 3, wherein said first electrode comprises a thickness of 500 to 5000 Å.

5. The electrode of claim 1, wherein said first electrode comprises a thickness of 100 to 300 Å and is selected from the group consisting of copper, silver, gold and platinum.

6. The electrode of claim 1, wherein at least one said aperture in said first electrode is 1 to 50 $\mu$m in width.

7. The electrode of claim 1, wherein said second electrode comprises an opaque, conductive material.

8. The electrode of claim 1, wherein said second electrode comprises a material selected from the group consisting of gold, silver, aluminum, copper, chrome, and combinations thereof.

9. The electrode of claim 1, wherein said second electrode comprises a thickness of 1 to 10 $\mu$m.

10. The electrode of claim 1, wherein said substrate comprises a material selected from the group consisting of glasses, ceramics and plastics.

11. The electrode of claim 1, wherein said substrate is glass.

12. The electrode of claim 1, wherein at least one of said apertures is widest at the point where the second electrode contacts the first due to undercut in forming said at least one aperture, and wherein material of said second electrode at least partially fills the region of said undercut.

13. A method of making an electrode comprising:
    forming a first electrode on a substrate having one or more apertures in said electrode; and
    forming a second electrode on said first electrode,
    wherein said second electrode makes contact with said substrate through at least one of said apertures.

14. The method of claim 13, wherein said first electrode is a transparent electrode and said second electrode is an opaque electrode.

15. The method of claim 13, wherein said second electrode is formed on said first electrode by sputtering or evaporation.

16. The method of claim 13, wherein said second electrode is formed on said first electrode by chemical vapor deposition.

17. The method of claim 13, wherein said second electrode is formed such that it at least partially fills an undercut portion of said one or more apertures.

* * * * *